United States Patent
Prieto Loefkrantz et al.

(10) Patent No.: US 9,338,936 B2
(45) Date of Patent: May 10, 2016

(54) WORKBENCH FOR MANUFACTURING OR CHECKING ELECTRICAL WIRING HARNESSES

(71) Applicant: EADS Construcciones Aeronauticas, S.A., Madrid (ES)

(72) Inventors: Alberto Diego Prieto Loefkrantz, Madrid (ES); Antonio De Marco Mendiela, Madrid (ES); Carlos Alejo Ramirez, Madrid (ES); Carlos Martinez Perez, Madrid (ES); Daniel Martinez Campos, Madrid (ES); Jose Carlos Diaz Cruz, Madrid (ES); Marco Antonio Escalera Castro, Madrid (ES); Raul Cano Bagaza, Madrid (ES); Raul Quesada Pegalajar, Madrid (ES)

(73) Assignee: EADS CONSTRUCCIONES AERONATUTICAS, S.A., Madrid (ES)

( * ) Notice: Subject to any disclaimer, the term of this patent is extended or adjusted under 35 U.S.C. 154(b) by 598 days.

(21) Appl. No.: 13/714,964

(22) Filed: Dec. 14, 2012

(65) Prior Publication Data
US 2013/0100277 A1 Apr. 25, 2013

(30) Foreign Application Priority Data

Aug. 16, 2012 (ES) .................................. 201231309

(51) Int. Cl.

| | |
|---|---|
| H05K 13/08 | (2006.01) |
| G06T 7/00 | (2006.01) |
| G06F 3/01 | (2006.01) |
| H01B 13/012 | (2006.01) |

(52) U.S. Cl.
CPC ................ *H05K 13/08* (2013.01); *G06F 3/011* (2013.01); *G06T 7/0004* (2013.01); *H01B 13/01209* (2013.01); *H01B 13/01227* (2013.01)

(58) Field of Classification Search
None
See application file for complete search history.

(56) References Cited

U.S. PATENT DOCUMENTS

| | | | |
|---|---|---|---|
| 6,169,934 B1 | 1/2001 | Nakayama et al. | |
| 6,272,387 B1 | 8/2001 | Yoon | |
| 7,507,113 B2 | 3/2009 | Aida et al. | |
| 7,647,695 B2 | 1/2010 | Macnutt et al. | |
| 2009/0216804 A1* | 8/2009 | Kersavage | G06Q 10/04 |
| 2011/0292080 A1* | 12/2011 | Oka | H04N 9/3179 345/634 |
| 2012/0062725 A1* | 3/2012 | Wampler, II | G01V 8/12 348/86 |

FOREIGN PATENT DOCUMENTS

WO 03031094 4/2003

OTHER PUBLICATIONS

Spanish Search Report, Aug. 16, 2012.

* cited by examiner

*Primary Examiner* — Eileen Adams
(74) *Attorney, Agent, or Firm* — Greer, Burns & Crain

(57) ABSTRACT

A workbench and an assistance method for manufacturing or checking electrical wiring harnesses. The workbench comprises: an assembly board; image projection devices on the assembly board; optical sensors arranged on the assembly board to provide information about its position; cameras arranged to capture gestures of the technician in charge of the workbench; a computer with a set of computer programs adapted to provide, through the image projection devices images in 1:1 scale of templates of the electrical wiring harness being manufactured or checked projected onto the assembly board and, superimposed on them, complementary images of aid requested by the technician, acting on virtual menus and/or buttons projected onto the assembly board.

10 Claims, 4 Drawing Sheets

WORKBENCH FOR MANUFACTURING OR CHECKING ELECTRICAL WIRING HARNESSES

FIELD OF THE INVENTION

The present invention relates to a workbench for manufacturing or checking electrical wiring harnesses and, more particularly, to a workbench for manufacturing or checking electrical wiring harnesses for the aerospace, shipbuilding and automotive industries.

BACKGROUND OF THE INVENTION

An electrical wiring harness is formed by a bundle of wires of different types arranged in a particular order which are bound together in order to facilitate the installation, repair and maintenance of the wires and the connection of a plurality of equipment distant from each other.

The electrical wiring harnesses used in particular in the aeronautic industry are quite complex by the number of wires and connectors that they have.

The manufacture of electrical wiring harnesses is traditionally done on an assembly board of wood using the manufacturing drawings and specifications on paper for performing the wiring routing and connection operations on said assembly board which can have holes to insert markers facilitating the routing of the wires.

The main difficulty of this manufacturing process is the handling of the manufacturing documentations on paper because of its complexity and the high possibility of making mistakes.

Several proposals to improve the process by eliminating the use of paper documentation have been made in the prior art.

U.S. Pat. No. 6,272,387 B1 describes a computerized information system for managing the documentation for manufacturing electrical wiring harnesses that allows displaying on a screen the routing and connection information of the wires making up an electrical wiring harness.

Patent application U.S. 2003/0163917 describes a system based preferably on a matrix of LEDs ("Light Emitting Diodes") to represent the wiring harness template, indicating the routing of the wires making up the wiring harness bundle.

Patent U.S. Pat. No. 6,625,299 B1 describes a system that uses augmented reality technology to display the wiring harness manufacturing documentation, using particularly HMD ("Head-Mounted Display") devices.

Patent U.S. Pat. No. 7,507,113 B2 describes a device and a method for assisting the technician in the manufacturing process through information displayed on a screen.

Patents U.S. Pat. No. 7,093,351 B2 and U.S. Pat. No. 7,647,695 B2 describe, respectively, a device and a method for assisting the technician on specific operations for guiding the connection of the wires of a connector.

Although all these proposals represent an advance over the traditional method of manufacturing electrical wiring harnesses, there is a need in the industry to improve the manufacture of electrical wiring harnesses, particularly in industries such as aeronautics, which are significantly increasing the use of electrical devices.

SUMMARY OF THE INVENTION

It is an object of the present invention to provide a workbench for manufacturing or checking electrical wiring harnesses that provides the technician with the documentation for manufacturing or checking electrical wiring harnesses in digital format and in an interactive way.

It is another object of the present invention to provide a workbench for

It is another object of the present invention to provide a method for assisting the manufacturing or checking of electrical wiring harnesses, providing access to a repository of digitized documentation to the technician in an effective way.

In a first aspect, these and other objects are met with a workbench for manufacturing or checking electrical wiring harnesses comprising the following devices: an assembly board on whose surface a technician performs the manufacturing or checking operations of the electrical wiring harness and, at least, one support table of said assembly board, one or more devices for projecting images on the assembly board, one or more optical sensors arranged in the assembly board to provide information about its position, one or more cameras arranged for capturing gestures of the technician. The workbench for manufacturing or checking electrical wiring harnesses also includes a computer connected to such devices and to a repository of documentation regarding the manufacture or checking of the wiring harness provided with a set of computer programs adapted to provide, through said devices for projecting images in 1:1 scale of templates of the electrical wiring harness being manufactured or checked projected on the assembly board and, superimposed to them, additional images of aid requested by the technician, acting on virtual menus and/or buttons projected on the assembly board.

In one embodiment, the workbench for manufacturing or checking electrical wiring harnesses comprises a plurality of support tables of the assembly board—on whose surface subgroups of operations of the electrical wiring harness being manufactured or checked are performed—which are configured with means for locking and unlocking the assembly board and displacement means of the assembly board from one support table to another support table.

In a second aspect the above-mentioned objects are met with an assistance

In one embodiment, the projected images in step a) comprise virtual menus for selecting an additional image of aid by the technician.

In one embodiment, said additional image of aid is generated by adding to the image of a wiring harness component (for example, a connector or a wire waiting to be routed) captured on the assembly board an aid image to facilitate the execution of an operation in said component (for example, the identification of the cavity of said connector to which a particular wire identified by its bar code must be connected or a graph illustrating the route of said cable).

Other desirable features and advantages of this invention will become apparent from the subsequent detailed description of the invention and the appended claims, in relation with the enclosed drawings.

DETAILED DESCRIPTION OF THE PREFERRED EMBODIMENTS

Figure 1:
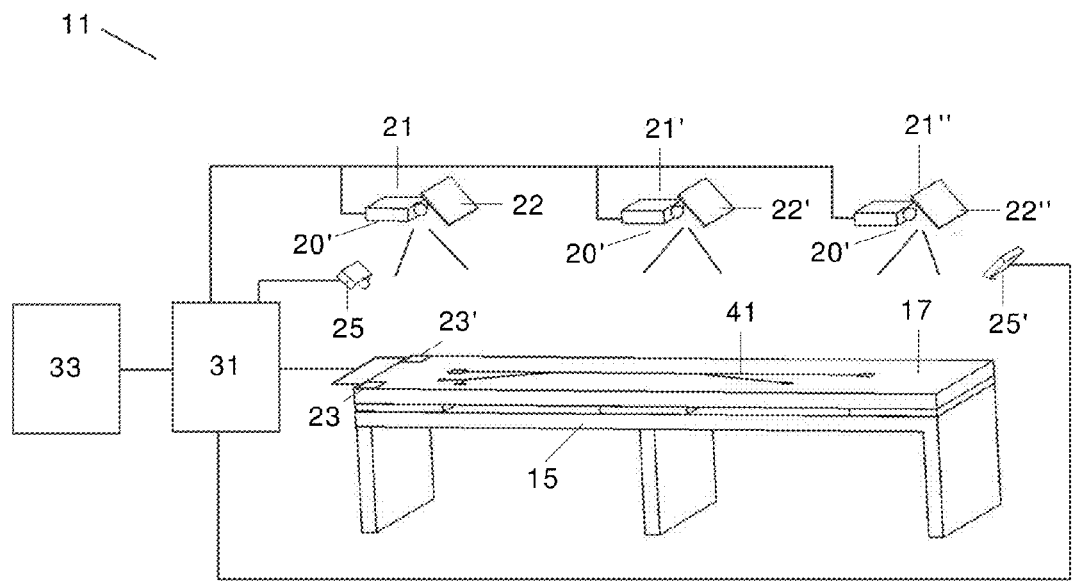
FIG. 1 is a schematic representation of a workbench for manufacturing or checking electrical wiring harnesses according to the invention.

FIG. 1 shows the main components of a workbench 11 for manufacturing or checking electrical wiring harnesses according to the invention:

An assembly board 17 disposed on a support table 15 on which a technician performs the operations necessary to manufacture or check an electrical wiring harness.

Several projecting images devices 21, 21', 21" that project directly on the assembly board 17 images 41 with the information necessary to manufacture or check a wiring harness, and in particular templates in 1:1 scale.

In the embodiment shown in FIG. 1 the devices 21, 21', 21" are formed by projectors 20, 20', 20" placed in a horizontal plane parallel to the assembly board 17 and mirrors 22, 22', 22" transforming the horizontal projection on a vertical projection on the assembly board 17.

In other embodiments where a horizontal assembly board 17 is not used the image projecting devices 21, 21', 21" are arranged so that the images are projected vertically on the assembly board 17.

The imaging devices 21, 21', 21" are arranged as a unitary assembly such that each of them projects a part of the image 41. Their number depends, among other factors, on the size of the assembly board 17.

Various optical sensors 23, 23' (only two of them are represented in FIG. 1 for simplicity) arranged in the assembly board 17 to facilitate the calibration of the imaging devices 21, 21', 21".

Various cameras 25, 25' to capture gestures of technicians and other images.

A computer 31 connected to the aforementioned devices and to a repository of documentation 33 hosting a digital mock-up of the wiring harness being manufactured or checked and other information relating to the wiring harness manufacture or check.

The computer 31 is provided with the set of computer programs 35 (see FIG. 2) which will be described below.

Figure 3:
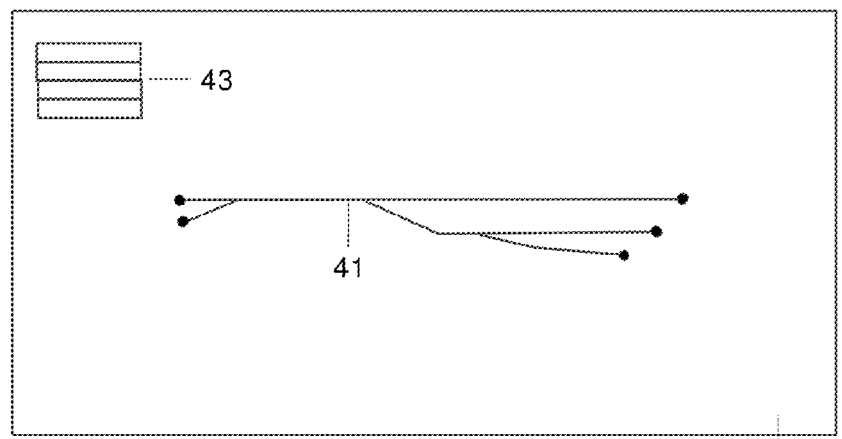
FIG. 3 is a schematic plan view of an assembly board in a workbench for manufacturing or checking electrical wiring harnesses according to the invention in which, in addition to images of the electrical wiring harness being manufactured

A gesture recognition program 51 that allows to the technician to request interactively the documentation needed for the wiring harness manufacture or check. The images projected on the assembly board 17 include for this purpose virtual menus 43 (see FIG. 3) which options may be selected by the technician positioning a finger of his hand on them. The corresponding selection is identified by the gesture recognition program 51 from the information provided by the cameras 25, 25'. Similarly, the technician may require documentation by operating virtual buttons (not shown) included in the projected images on the assembly board 17.

An image management program 53 which executes the homographies and transformations of the image which is projected onto the assembly board 17 to maintain the 1:1 scale and manages the different windows of information projected on the assembly board 17.

A calibration program 55 which carries out the calibration of the projecting images devices 21, 21', 21" processing the signals sent by the optical sensors 23, 23' when certain pre-established patterns are projected on the assembly board 17.

A control program 57 which manages and distributes the image sent to each of the projecting images devices 21, 21', 21".

A documentation management program 59 that obtains the information that must be projected onto the assembly board 17 in the various databases included in the repository of documentation 33, for example, a database 36 which contains the digital mock-up of the harness being manufactured or checked, a database 37 containing the list of wires that make up wiring harness the being manufactured or checked and a database 38 which contains the documentation relating to the sequence of the manufacturing or checking operations of the electrical wiring harness.

Figure 2:
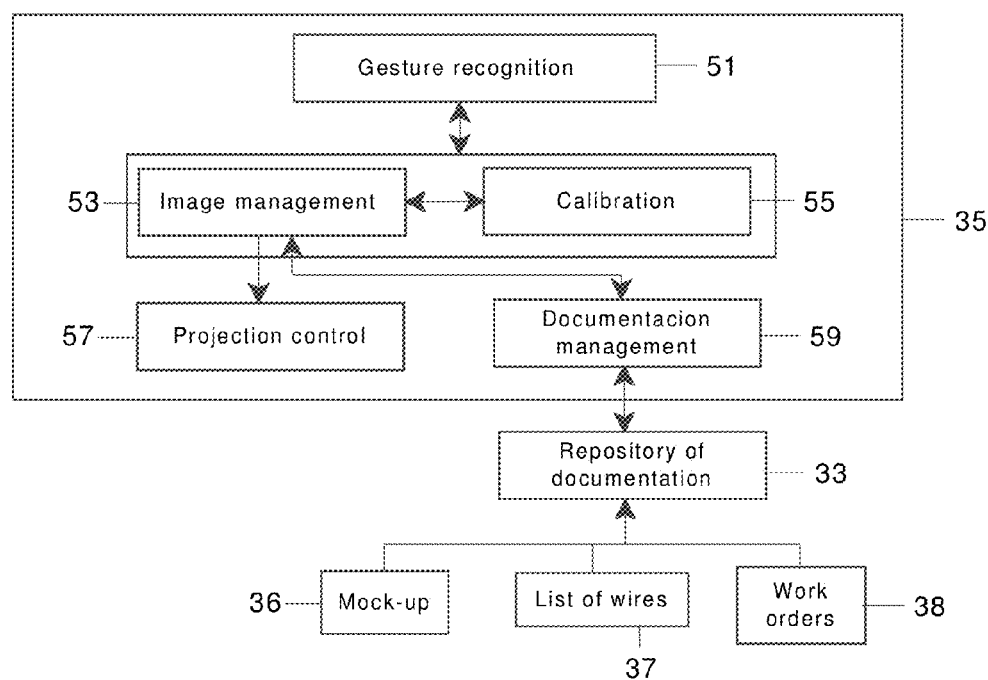
FIG. 2 is a diagram showing the set of computer programs used by the computer incorporated into the workbench for manufacturing or checking electrical wiring harnesses according to the invention.

The interactions between different programs are indicated in FIG. 2, some of them being the following:

The interaction between the gesture recognition program 51, the image management program 53 and the documentation management program 59 to attend a request from a technician. The gesture recognition program 51 identifies the technician's finger position on the assembly board 17 to select a menu option, the image management program 53 identifies this menu option and requests the corresponding image to the documentation management program 59 that gets it from the repository 33.

The interaction between the image management program 53 and the calibration program 55. The image management program 53 sends to the projecting images devices 21, 21', 21" a series of pre-established patterns and the calibration program 55 uses the signals transmitted by sensors 23, 23' for carrying out the calibration of said devices 21, 21', 21".

The interaction between the documentation management program 59 and the image management program 53 allows decoupling the image processing operations required for a 1:1 scale projection on the assembly board 17 from the management operations of the digital documentation related to the manufacturing or checking of a wiring harness.

The workbench 11 for manufacturing or checking electrical wiring harnesses may comprise additional devices and computer programs for providing additional complementary images to carry out specific tasks such as those indicated below.

Figure 4:
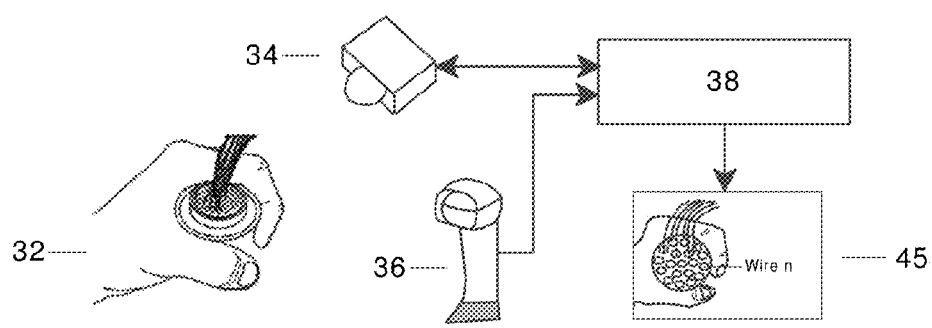
FIG. 4 is a schematic view of an additional equipment of the workbench for manufacturing or checking electrical wiring harnesses according to the invention to provide additional assisting information for connecting a wire to a connector.
Figure 5:
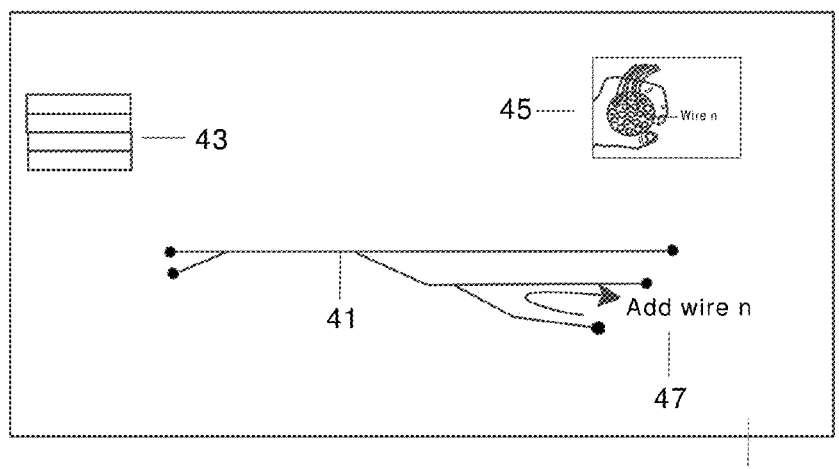
FIG. 5 is a schematic plan view of an assembly board in a workbench for manufacturing or checking electrical wiring harnesses according to the invention in which, in addition to images of the electrical wiring harness being manufactured or checked, an assisting image for connecting a cable to a connector is projected.

To simplify the wire connection tasks, the workbench 11 for manufacturing or checking electrical wiring harnesses also comprises (see FIG. 4), on the one hand, one or more cameras 34 and one or more barcode reader devices 36 that allow, respectively, capture the image of a particular connector and the identification code of the wire to be connected and, on the other hand, a connecting wires assistance computer program 38 installed in the computer 31 to generate an additional image 45 with the surface of the connector and an indication of the connector cavity where the wire shall be inserted. That image 45 is projected on the assembly board 17 superimposed to the image 41 of the wiring harness template (see FIG. 5). In another embodiment of a workbench 11 for manufacturing or checking electrical wiring harnesses, the additional image 45 is projected onto a display screen incorporated therein.

To facilitate the wiring routing tasks, the workbench for manufacturing or checking electrical wiring harnesses 11 would use a barcode reader device 36 to obtain the identification code of a given wire and a routing wires assistance computer program to generate an additional image 47 that facilitates the routing of said cable.

Figure 6:
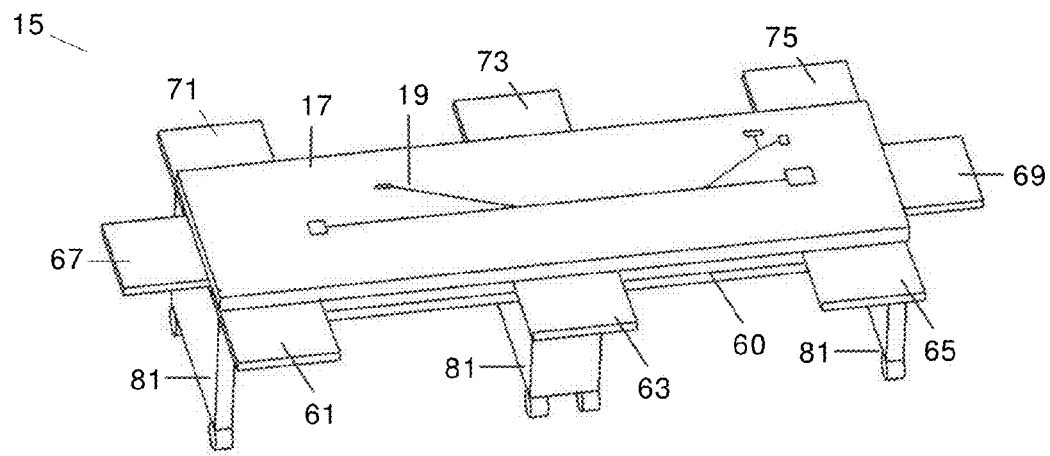
FIG. 6 is a schematic perspective view of a workbench of manufacture or testing of electrical wiring harnesses according to the invention with an assembly board disposed on a support table.
Figure 7:
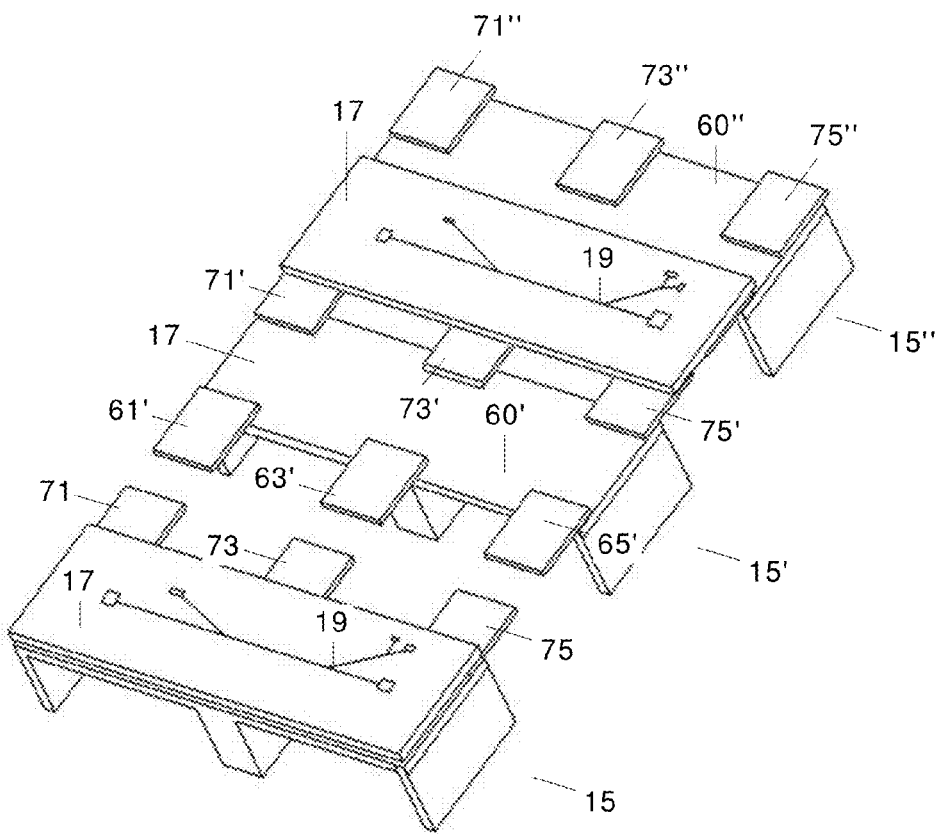
FIG. 7 is a perspective view of a workbench for manufacturing or checking electrical wiring harnesses according to the invention with three support tables in a time of the working process in which an assembly board is moving from one support table to another.
Figure 8:
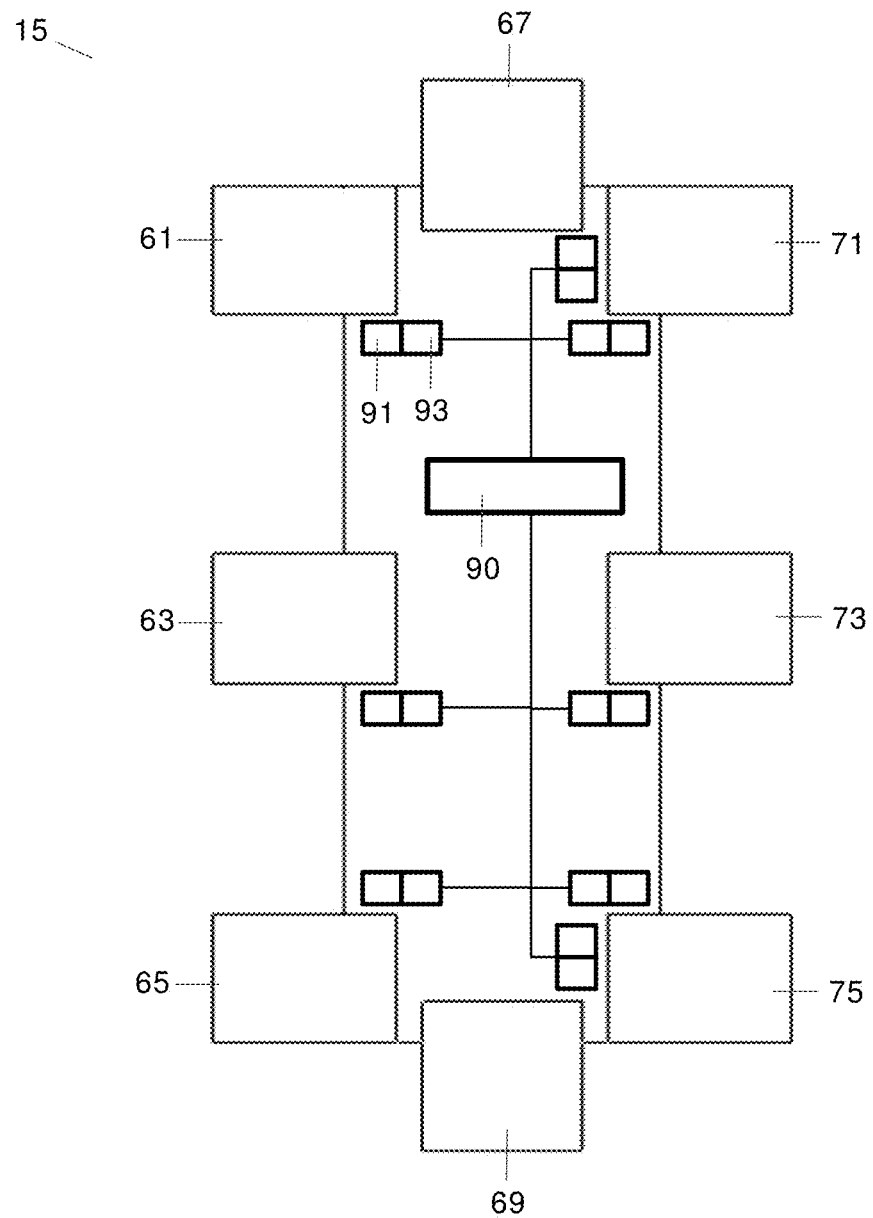
FIG. 8 is a schematic diagram of equipment installed on a support table for moving an assembly board.

In one embodiment of the invention, the workbench 11 for manufacturing or checking electrical wiring harnesses comprises a plurality of support tables of the assembly board 17 so that it can pass through several support tables during the As shown in FIGS. 6, 7 and 8, a support table 15 of an assembly board 17 is a mechanical structure with movable feet 81 configured by a receiving surface 60 of the assembly board 17, three pairs of side trays 61, 71, 63, 73, 65, 75 and a pair of front trays 67, 69 which can be arranged in a retracted position and in an extended position by operating traction devices 91 controlled by a control unit 90 with the information provided by sensors 93 (see FIG. 8).

FIG. 7 shows an assembly board 17 with an electrical wiring harness 19 being displaced from the support table 15' to the adjacent support table 15". The electrical wiring harness 19 is fixed to the assembly board 17 by auxiliary fixation means (not shown).

That displacement is made in the following sequence:

The three pairs of side trays 71', 61"; 73', 63"; 75', 65" of the support tables 15' and 15" are actuated to place them in its extended position.

The assembly board 17 is disengaged from the support table 15' and rolling means are successively actuated for carrying the assembly board 17 to the receiving surface 60" of the support table 15" passing through the side trays 71', 73', 75' of the support table 15' and through the side trays 61", 63", 65" of the support table 15". Once positioned the assembly board 17 in the support table 15", is locked to it.

The aforementioned control unit 90 is arranged so that the aforementioned displacements of the side trays of the support tables and of the assembly board are carried out in an automated manner.

Among the advantages of the present invention the following can be mentioned:

Eliminates the need to print the manufacturing documentation, projecting it directly on the assembly board with significant benefits for technicians.

The latest version of the manufacturing documentation is used avoiding the use of outdated information.

It provides an immediate response to a design modification work projecting on the assembly board the new template without any need of moving the wiring harness.

It enhances productivity by providing only the information required at all times to avoid overexposure of information.

Although the present invention has been described in connection with various embodiments, it will be appreciated from the specification that various combinations of elements, variations or improvements therein may be made, and are within the scope of the invention.

The invention claimed is:

1. A workbench for manufacturing or checking electrical wiring harnesses having an assembly board on whose surface manufacturing or checking operations of the electrical wiring harnesses are performed by, at least, one technician, with the aid of documentation describing the electrical wiring harness being manufactured or checked, and at least one support table of said assembly board, comprising:
   a) one or more image projection devices on the assembly board;
   b) one or more optical sensors arranged on the assembly board to provide information about a position relative to the assembly board;
   c) one or more cameras arranged to capture gestures of the technician;
   d) a computer, connected to said image projection devices, to said optical sensors, to said cameras and to a repository of documentation related to the electrical wiring harness being manufactured or checked, provided with a set of computer programs adapted to provide, through the image projection devices images in 1:1 scale of templates of the electrical wiring harness being manufactured or checked projected onto the assembly board and, superimposed on the corresponding images of the templates, complementary images of aid requested by the technician, acting on virtual menus or buttons projected onto the assembly board;
   e1) a gesture recognition computer program adapted to identify the option of the virtual menu or button indicated by the technician from the information provided by said cameras;
   e2) an image management computer program adapted to perform scale transformation processes of the images contained in that repository so that the images can be projected on the assembly board in the scale required;
   e3) a computer program for calibrating the image projection devices adapted to perform said calibration processing the information detected by said position sensors on projections of pre-established patterns onto the assembly board;
   e4) a control computer program of the image projection devices adapted to manage and distribute the images sent to each of the corresponding image projection devices;
   e5) a documentation management computer program adapted to find in said repository the image that must be projected on the assembly board and send the image to the image management computer program.

2. The workbench for manufacturing or checking electrical wiring harnesses according to claim 1, wherein said image projection devices include projectors arranged parallel to the assembly board and mirrors arranged at 45° with respect to the projectors.

3. The workbench for manufacturing or checking electrical wiring harnesses according to claim 2, wherein said assembly board is arranged in a horizontal plane.

4. The workbench for manufacturing or checking electrical wiring harnesses according to claim 1, further comprising at least one reader device of an identification code of wires and an auxiliary camera and in which the computer further includes an assistance computer program for connecting wires adapted to generate an additional image of aid for connecting a wire identified by said reader device and an assistance computer program for routing wires adapted to generate an additional image of aid for routing a wire identified with said reader device.

5. The workbench for manufacturing or checking electrical wiring harnesses according to claim 1, further comprising a plurality of support tables of the assembly board in which sub-groups of operations of the electrical wiring harness being manufactured or checked are performed, said support tables being configured with locking and unlocking means of the assembly board and displacement means of the assembly board from one to another supporting table.

6. The workbench for manufacturing or checking electrical wiring harnesses according to claim 5, wherein:

each supporting table is configured with a receiving surface of an assembly board and one or more pairs of movable trays between a closed position and an extended position in the direction of displacement of the assembly board actuating a first driving device, the receiving surfaces of the assembly board and the pairs of movable having rolling means in the displacement direction actuated by a second driving device; and the workbench includes control means for, firstly, to move the adjoining movable trays of two adjoining support tables to respective extended positions, secondly, to move the assembly board from the receiving surface of the first of said support tables to the receiving surface of the second of said support tables passing through the movable trays placed between said support tables and, thirdly, to move said movable trays to respective closed positions.

7. An assistance method for manufacturing or checking electrical wiring harnesses providing access to a repository of documentation, including a digital mock-up of the electrical wiring harness, to a technician in charge of the manufacture of check of an electrical wiring harness, comprising the steps of:

a) projecting images in 1:1 scale of templates of the electrical harness being manufactured or checked onto the assembly board where said task is being carried out;

b) projecting, at a request of the technician, at least one additional image of aid for the manufacture or check of the electrical wiring harness onto the assembly board, superimposed to the images of step a);

wherein said at least one additional image of aid is generated by adding, to the image of a component of the electrical wiring harness being manufactured or checked captured on the assembly board, an image of aid to facilitate an execution of an operation for the component by displaying a relational configuration of the component and the electrical wiring harness.

8. The assistance method according to claim 7, wherein the projected images in step a) include virtual menus for selecting an additional image of aid by the technician.

9. The assistance method according to claim 7, wherein said component is a connector and said additional image of aid shows a cavity of the connector where a wire identified by a barcode is connected.

10. The assistance method according to claim 7, wherein said component is a wire identified by a barcode and said additional image of aid is a graphic illustrating a routing of the wire.

* * * * *